United States Patent [19]

Kohno

[11] Patent Number: 5,022,003
[45] Date of Patent: Jun. 4, 1991

[54] SEMICONDUCTOR MEMORY DEVICE
[75] Inventor: Takaki Kohno, Tokyo, Japan
[73] Assignee: NEC Corporation, Tokyo, Japan
[21] Appl. No.: 515,018
[22] Filed: Apr. 26, 1990
[30] Foreign Application Priority Data
Apr. 27, 1989 [JP] Japan .................................. 1-108309
[51] Int. Cl.[5] .............................................. G11C 13/00
[52] U.S. Cl. ................................ 365/189.01; 365/190;
365/208; 365/226
[58] Field of Search .................... 365/189.01, 185, 190,
365/226, 208; 307/530
[56] References Cited
U.S. PATENT DOCUMENTS
4,851,720  7/1989  Pathak et al. ....................... 307/208

Primary Examiner—Terrell W. Fears
Attorney, Agent, or Firm—Sughrue, Mion, Zinn, Macpeak & Seas

[57] ABSTRACT

A semiconductor memory device includes a plurality of memory cells organized in a matrix structure and a sense-amplifier circuit for detecting a voltage at a digit line which changes in accordance with the stored information in the accessed memory cell. The sense-amplifier circuit includes at least six field effect transistors of which two pair each are for effecting current amplification to produce a sense output to an inverter circuit or through a comparison detector or directly. The amplification of current is increased and the amplitude of sense-amplifier output voltage is reduced so that the sense-amplifier output can be inverted at a high speed.

9 Claims, 9 Drawing Sheets

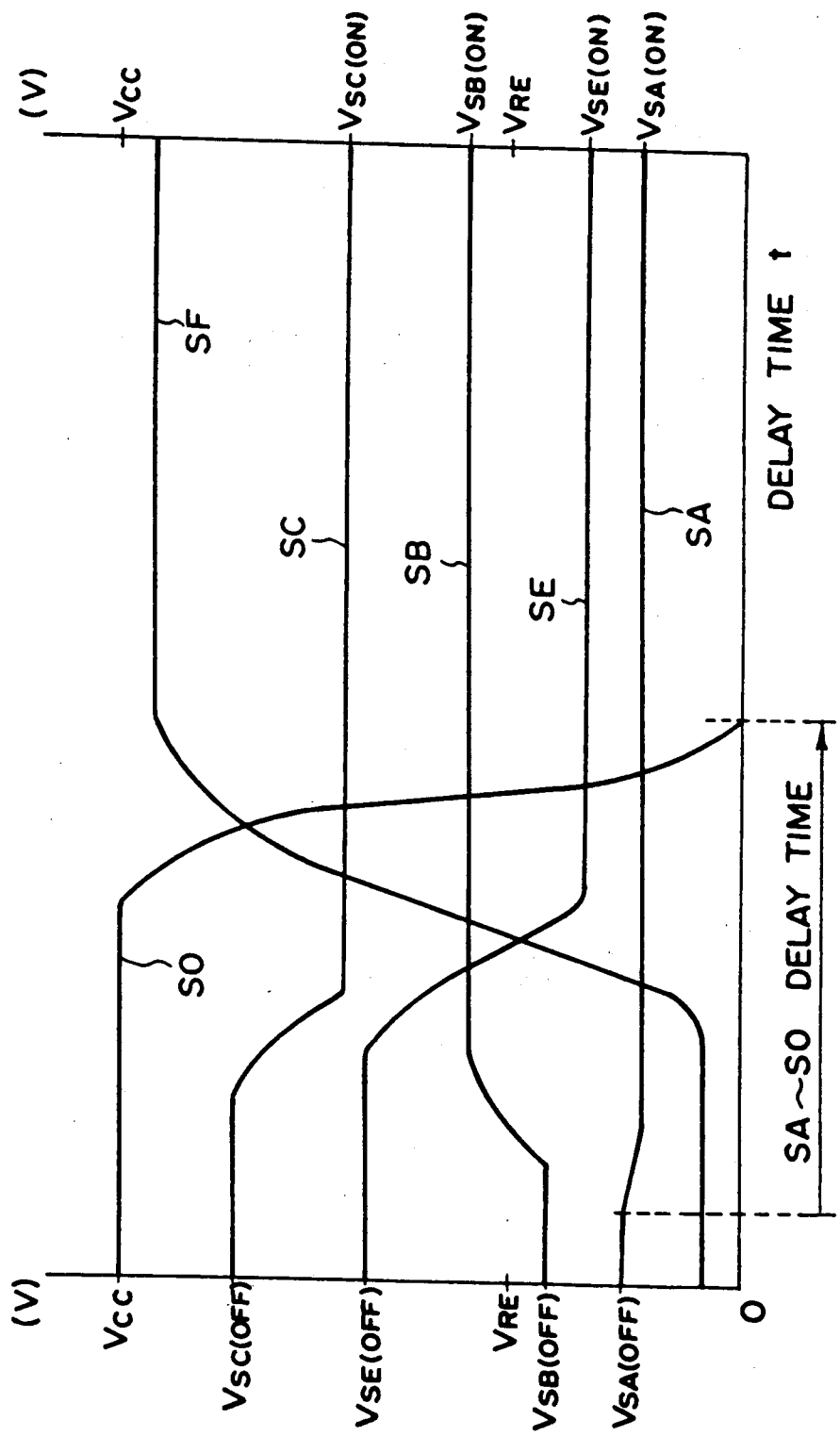

SEMICONDUCTOR MEMORY DEVICE

BACKGROUND OF THE INVENTION

The present invention relates to a semiconductor memory device the main element of which comprises a field effect transistor of an insulated gate type and, more particularly, to a read-out circuit of a semiconductor memory device in which a high speed read-out operation is required.

The inversion speed of a sense-amplifier output of the conventional semiconductor memory device at a read-out operation depends on the current which flows in the related transistors at the output stage therein. The current flowing in the transistors is governed by the mutual conductance of the memory cells.

However, in the conventional large capacity semiconductor memory device, the mutual conductance of the memory cells tends to be set at a low value for such reasons that the gate width of the memory cell is required to be made as small as possible and that the memory cells are integrated in a stacked or multi-layered construction in order to increase the integration or packing density of the memory cell array.

One of the problems encountered in the conventional memory devices was that it lacked sufficient capacity to drive the inverter amplifier leading to an output buffer and, therefore, the amplitude of the sense-amplifier output voltage had to be large resulting in a low inversion speed of the sense-amplifier output.

Thus, such conventional semiconductor memory devices were not suited for a semiconductor memory device which required a large capacity and a high speed at the read-out operation.

SUMMARY OF THE INVENTION

It is, therefore, one object of the invention to overcome the problems existing in the conventional semiconductor memory devices and to provide an improved read-out circuit of a semiconductor memory device.

It is another object of the invention to provide a semiconductor memory device which is capable of carrying out a high speed read-out operation.

It is still further object of the invention to provide a large-capacity semiconductor memory device in which the output of a sense-amplifier is inverted at a high speed.

In accordance with one aspect of the present invention, there is provided a semiconductor memory device including a plurality of memory cells organized in a matrix structure and a sense-amplifier circuit for detecting a voltage at a digit line which changes in accordance with the stored information in the accessed memory cell, the sense-amplifier circuit comprising:

a first inverter amplifier having its input coupled to the digit line;

a first field effect transistor having its gate connected to the output of the first inverter amplifier and its source electrically coupled to the digit line;

a second field effect transistor having its source connected to a first power supply terminal and its gate and drain connected to the drain of the first field effect transistor;

a third field effect transistor having its gate connected to the drain of the first field effect transistor and its source connected to the first power supply terminal;

a fourth field effect transistor having its gate and drain connected to the drain of the third field effect transistor and its source connected to a second power supply terminal;

a fifth field effect transistor having its gate connected to the drain of the second field effect transistor, its drain connected to the first power supply terminal and its source connected to one input of a comparison detector; and a sixth field effect transistor having its gate connected to the drain of the third field effect transistor, its drain connected to the source of the fifth field effect transistor and its source connected to the second power supply terminal.

The semiconductor memory device according to the present invention is different from the conventional device in that, in the sense-amplifier circuit in the former, the amplification of current is increased and the amplitude of the sense-amplifier output voltage is reduced so that the sense-amplifier output can be inverted at a high speed.

According to another aspect of the present invention, there is also provided a semiconductor memory device including a plurality of memory cells and a sense-amplifier circuit for detecting a voltage at a digit line which changes in accordance with the stored information in the accessed memory cell, the sense-amplifier circuit comprising:

a first inverter amplifier having its input coupled to the digit line;

a first effect transistor having its gate connected to the output of the first inverter amplifier and its source electrically coupled to the digit line;

a second field effect transistor having its source connected to a first power supply potential and its gate and drain connected to the drain of the first field effect transistor;

a third field effect transistor having its gate connected to the drain of the first field effect transistor and its source connected to the first power supply potential;

a fourth field effect transistor having its gate and drain connected to the drain of the third field effect transistor and its source connected to a second power supply potential;

a fifth field effect transistor having its gate connected to the drain of the second field effect transistor, its drain connected to the first power supply potential and its source connected to an input of a second inverter amplifier as an output of the memory device; and a sixth field effect transistor having its gate connected to the drain of the third field effect transistor, its drain connected to the source of the fifth field effect transistor and its source connected to the second power supply potential.

BRIEF DESCRIPTION OF THE DRAWINGS

The above and other objects, features and advantages of the present invention will be apparent from the following description of preferred embodiments of the invention, with reference to the accompanying drawings, in which:

FIG. 3 shows voltage waveforms at the respective nodes in the circuit shown in FIG. 1;

PREFERRED EMBODIMENTS OF THE INVENTION

For the purpose of assisting in the understanding of the present invention, a conventional semiconductor memory device will first be described by making reference mainly to FIGS. 7 to 10 before the present invention is explained.

Figure 7:
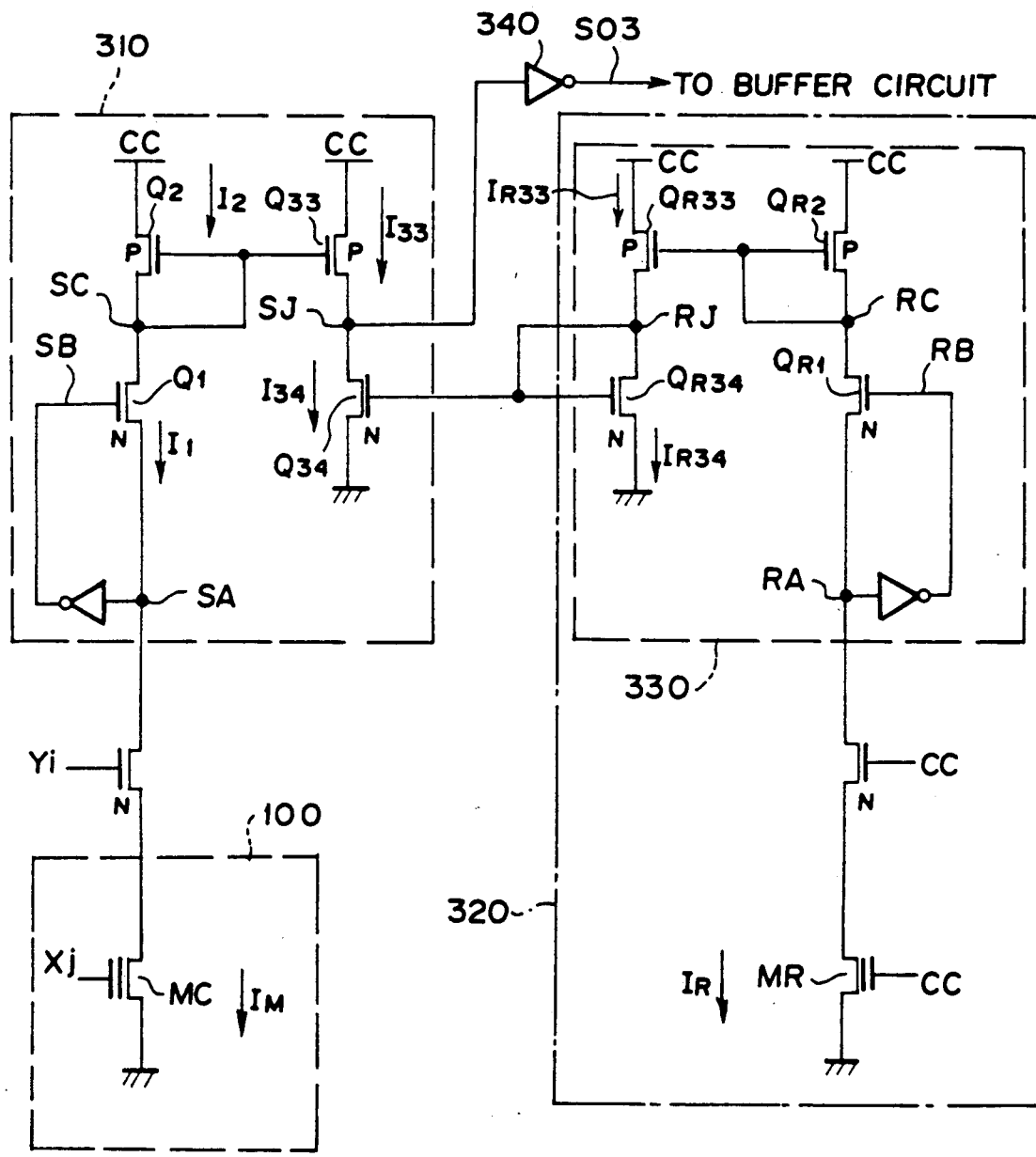
FIG. 7 shows a circuit diagram of a conventional semiconductor memory device.

FIG. 7 shows a main portion of a conventional read-out circuit of a semiconductor memory device.

Hereinafter, with reference to FIG. 7, an explanation will be made concerning the performance of the circuit which takes place in the read-out operation.

A memory cell array 100 comprises memory elements or memory cells arranged in a matrix form having columns and rows with the columns being accessed by Y address lines $Y_i$ and the rows being accessed by X address lines $X_j$ for the selection of one bit memory cell. For simplicity of the explanation, only one bit of the selected memory cell MC is shown in FIG. 7.

The memory cell MC is set when the read-out takes place by the selection of one of the two threshold voltages. Assuming that the two threshold voltages are $V_{TLow}$ and $V_{THigh}$ respectively and the voltage applied to the gate of the selected memory cell MC at the read-out operation is $V_G$, the respective voltages will be set so as to satisfy such relation as $V_{TLow} < V_G < V_{THigh}$.

When the memory cell MC in which the threshold voltage at the read-out operation is $V_{TLow}$ is selected, this memory cell changes to a conductive state which is hereinafter referred to as "ON bit".

On the other hand, when the threshold voltage is $V_{THigh}$, the memory cell changes to a non-conductive state which is hereinafter referred to as "OFF bit".

Figure 8:
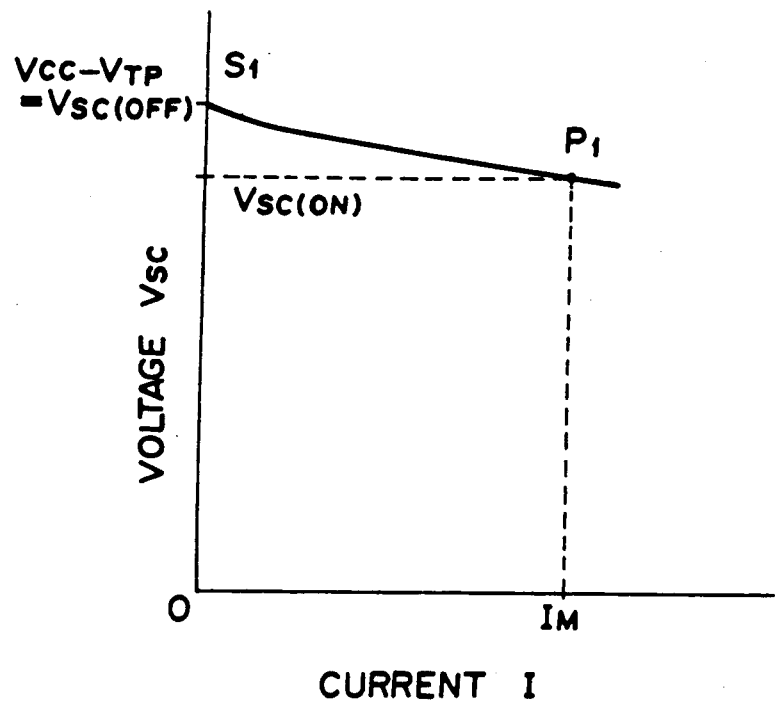
FIG. 8 shows load characteristic curve of the sense-amplifier circuit involved in the circuit shown in FIG. 7.

In the arrangement as shown in FIG. 7, if the selected memory cell MC is "ON bit", the current $I_M$ flows to the memory cell MC, the voltage at a node SA goes down, the voltage at a node SB goes up, and a field effect transistor $Q_1$ of an N-channel type becomes conductive so that the voltage at a node SC changes, along the load curve shown in FIG. 8, from $V_{CC} - V_{TP}$ (i.e., the difference between the supply voltage $V_{CC}$ and a threshold voltage of a transistor $Q_2$) and reaches an equilibrium at a point $P_1$ (hereinafter referred to as "$V_{SC(ON)}$"). At this instance, the current $I_M$ flows also in the field effect transistor $Q_2$ of a P-channel type. A transistor $Q_{33}$ of a P-channel type is designed to have such a dimension that the current $n \cdot I_M$ (n: real number) flows therein.

When the "OFF bit" memory cell is accessed or selected, the memory cell MC is non-conductive and the voltage $V_{SC}$ of the node SC reaches an equilibrium at a point $S_1$ in FIG. 8. The voltage of the point $S_1$ is $V_{CC} - V_{TP}$ which is hereinafter referred to as "$V_{SC(OFF)}$".

In a reference voltage generating circuit 320 shown in FIG. 7, a dummy cell MR having the same construction as the memory cell MC is "ON bit" in which the current $I_R (= I_M)$ flows when the read-out operation takes place.

A sense-amplifier circuit 310 and a sub-reference circuit 330 are different from each other only in their field effect transistors $Q_{34}$ and $Q_{R34}$ of an N-channel type and they are designed so as to satisfy the relation of $\beta_1 = m \cdot \beta_2$ (m: real number) where $\beta_1$ and $\beta_2$ are the gate width to gate length ratios of the transistor $Q_{34}$ and the transistor $Q_{R34}$, respectively. The current that flows to a field effect transistor $Q_{R33}$ of a P-channel type is $n \cdot I_R (= n \cdot I_M)$ and, the current that flows to the transistor $Q_{34}$ is $n/m \cdot I_M$ at the "ON bit" selection and the current does not flow at the "OFF bit" selection.

Figure 9:
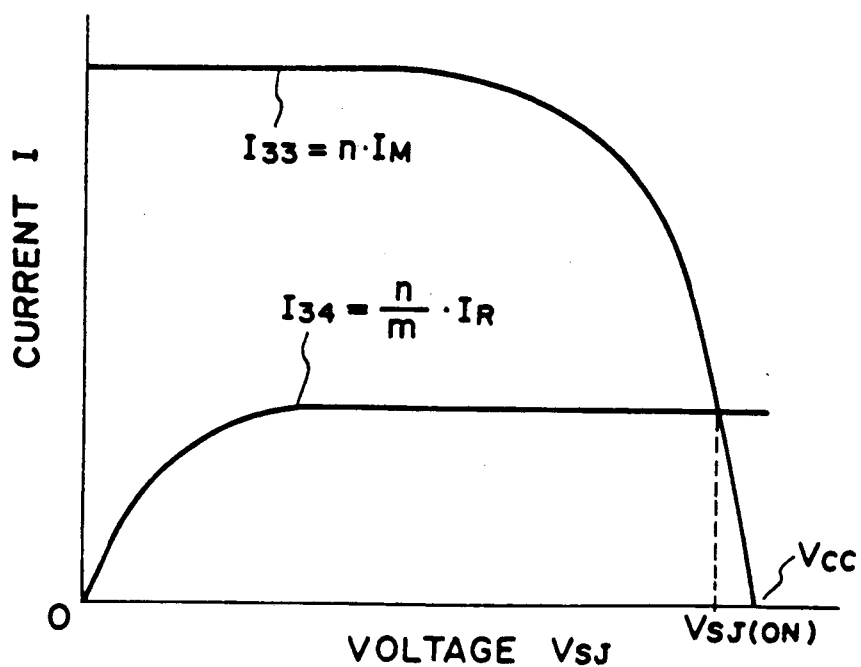
FIG. 9 shows current-voltage characteristic curves of the same circuit.

FIG. 9 shows current-voltage characteristic curves of the sense-amplifier 310. Assuming that the current that flows to each of the transistors $Q_{33}$, $Q_{34}$, $Q_{R33}$ is $I_{33}$, $I_{34}$, $I_{R33}$, the voltage $V_{SJ}$ at the node SJ will be at the GND (ground) level since no current $I_{33}$ flows in the transistor $Q_{33}$ at the "OFF bit" selection.

On the other hand, at the "ON bit" selection, the voltage $V_{SJ(ON)}$ at the intersecting point of the two current-voltage I-V curves is outputted.

Figure 10:
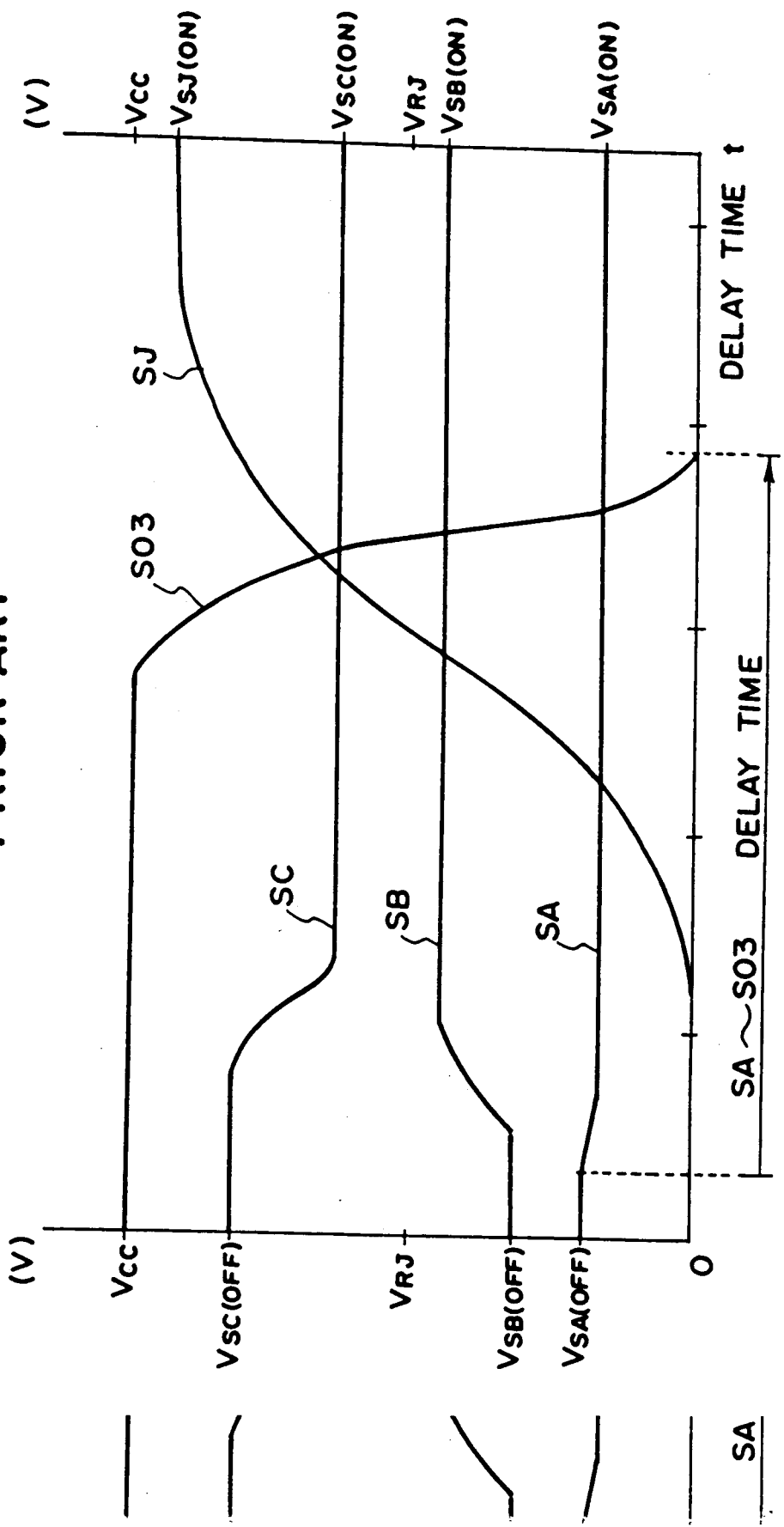
FIG. 10 shows voltage waveforms at the respective nodes in the circuit shown in FIG. 7.

FIG. 10 shows voltage waveforms at the respective nodes SA, SB, SC, SJ and SO3 at the "ON bit" selection. This shows that, by amplifying small voltage changes at the node SA, it is possible to obtain the necessary output.

The inversion speed of the sense-amplifier output $V_{SJ}$ of the conventional semiconductor memory device as explained above depends on the current $I_{33}$, $I_{34}$ which flows into the transistors $Q_{33}$, $Q_{34}$. As may be shown by $I_{33} = n \cdot I_M$ and $I_{34} = n/m \cdot I_R (= n/m \cdot I_M)$, the current $I_{33}$, $I_{34}$ is governed by the mutual conductance gm of the memory cell.

However, in a semiconductor device having a large capacity, the mutual conductance gm of the memory cell tends to be set at a low value for such reasons that the gate width of the memory cell should be made as small as possible and that the memory cells are integrated in a stacked form or multi-layered form in order to increase the integration or packing density of the memory cell array.

For example, in a mask-ROM having a large capacity, the current $I_{33} = n \cdot I_M$ is set in the order of $4 \times 15$ $\mu A = 60$ $\mu A$ so that, in addition to the lack of sufficient capacity to drive the inverter amplifier leading to an output buffer, the amplitude of the sense-amplifier output voltage $V_{SJ}$ is large resulting in a low inversion speed at the node SJ.

Thus, one of the problems of the conventional semiconductor memory device as explained above is that such device is not suited for a semiconductor memory device which requires a large capacity and a high speed operation.

Hereinafter, some examples of a semiconductor memory device according to the present invention will be explained in detail by making reference mainly to FIGS. 1 to 6.

Figure 1:
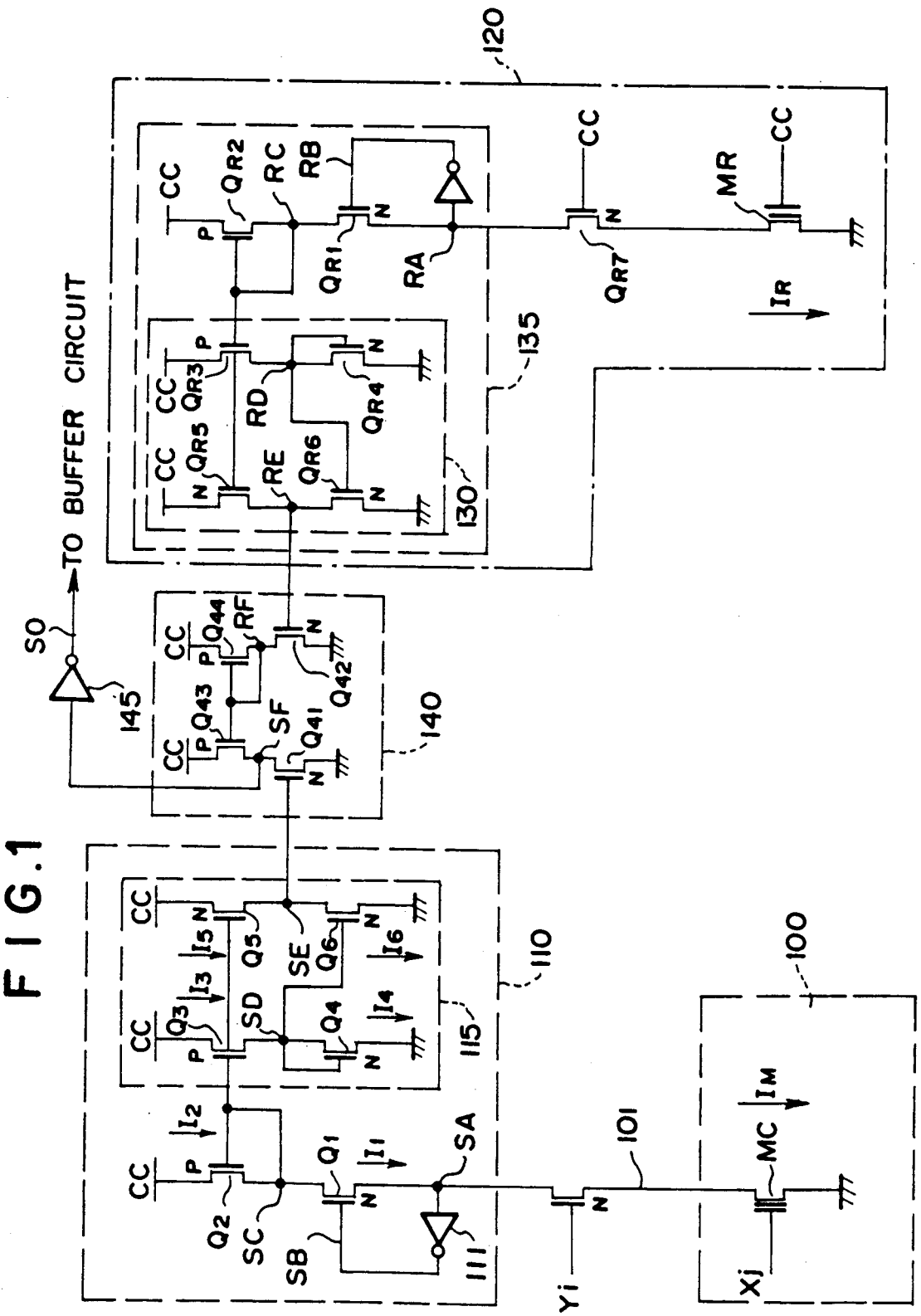
FIG. 1 shows a circuit diagram of a semiconductor memory device of a first embodiment according to the invention.

FIG. 1 shows a semiconductor memory device of the first embodiment according to the present invention. The same or similar reference numerals and symbols herein refer to the same or similar elements in the prior art explained above.

The semiconductor memory device of this first embodiment according to the present invention comprises a memory cell array 100 composed of a plurality of memory cells MC organized in a matrix structure; a sense-amplifier circuit 110 for detecting the voltage of the digit line 101 which voltage changes in response to the stored information "0" or "1" in the memory cell MC selected; a reference voltage generating circuit 120 for outputting a reference voltage $V_{RE}$ which is intermediary between the output voltage $V_{SE}$ of the sense-amplifier circuit 110 at the memory output of "0" and the output voltage $V_{SE}$ of the sense-amplifier circuit 110 at the memory output of "1"; and a comparison detector 140 for comparing the output voltage of the sense-amplifier circuit 110 with the output reference voltage of the reference voltage generating circuit 120 and detecting a difference therebetween.

The sense-amplifier circuit 110 comprises a first inverter amplifier 111 having its input coupled to the digit line 101; a first field effect transistor $Q_1$ of an N-channel type having its gate connected to the output of the first inverter amplifier 111 and its source electrically coupled to the digit line 101; a second field effect transistor $Q_2$ of a P-channel type having its source connected to the power supply $V_{CC}$ and its tied gate and drain connected to the drain of the first field effect transistor $Q_1$; a third field effect transistor $Q_3$ of a P-channel type having its gate connected to the drain of the second field effect transistor $Q_2$ and its source connected to the power supply $V_{CC}$; a fourth field effect transistor $Q_4$ of an N-channel type having its tied gate and drain connected to the drain of the third field effect transistor $Q_3$ and its source grounded; a fifth field effect transistor $Q_5$ of an N-channel type having its gate connected to the drain of the second field effect transistor $Q_2$, its drain connected to the power supply $V_{CC}$ and its source connected to the input of the comparison detector 140, and a sixth field effect transistor $Q_6$ of an N-channel type having its gate connected to the drain of the third field effect transistor $Q_3$, its drain connected to the source of the fifth field effect transistor $Q_5$ and its source grounded.

Further, the reference voltage generating circuit 120 has the same circuit configuration as the sense-amplifier circuit 110 and has an arrangement wherein the node corresponding to the digit line 101 in the sense-amplifier circuit 110 is connected to the drain of a field effect transistor MR which is controlled constantly to be conductive.

Next, an explanation will be made of the operation of the circuit according to the present embodiment. The currents flowing in the respective field effect transistors $Q_1$ through $Q_6$ in the sense-amplifier circuit 110, $Q_{R1}$ through $Q_{R6}$ in the reference voltage generating circuit 120 are referred to as $I_1$ through $I_6$, $I_{R1}$ through $I_{R6}$, respectively and the voltage at each node at the "ON bit" selection is referred to as $V_{(ON)}$ and the voltage at each node at the "OFF bit" selection is referred to as $V_{(OFF)}$.

Figure 2A:
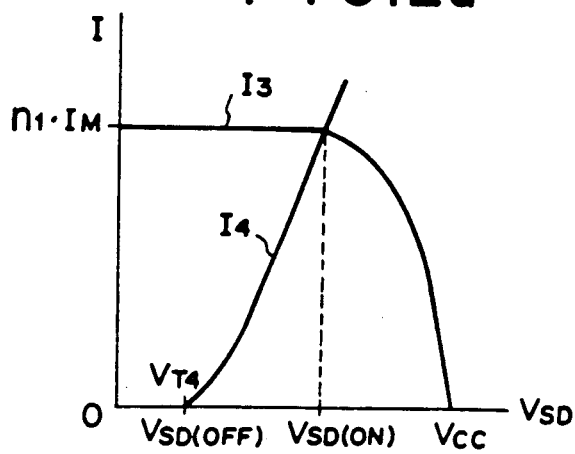
FIGS. 2a–2d show current-voltage characteristic curves of the sense-amplifier circuit involved in the circuit shown in FIG. 1.

Assuming here that, in an output stage 115 in the sense-amplifier circuit 110, the gate width to gate length ratios of the third transistor $Q_3$ and the second transistor $Q_2$ are $\beta_3$ and $\beta_2$, respectively. The transistor $Q_3$ in the output stage 115 will be designed to satisfy the relation of $\beta_3 = n_1 \cdot \beta_2$ ($n_1$: real number). Here, since the current which flows in the memory cell MC at the "ON bit" selection is $I_M$, the relations of $I_2 = I_M$ and $I_3 = n_1 \cdot I_M$ are satisfied. This means that the transistor $Q_3$ amplifies $I_M$ by $n_1$ times. Here, reference is made to FIGS. 2a through 2d which show the current-voltage characteristic curves of the sense-amplifier circuit 110. FIG. 2a shows the current-voltage characteristic curves of the third and fourth transistors $Q_3$ and $Q_4$. The point at which the two curves intersect will be the voltage $V_{SD(ON)}$ of the node SD at the "ON bit" selection and the voltage $V_{SD(OFF)}$ of the node SD at the "OFF bit" selection will be the threshold voltage $V_{T4}$ of the fourth transistor $Q_4$.

When the ratio of the gate width to gate length of the fourth transistor $Q_4$ and that of the sixth transistor $Q_6$ are assumed to be $\beta_4$ and $\beta_6$, respectively, the design may be $\beta_6 = n_2 \cdot \beta_4$ ($n_2$: real number) in which case the current that flows in the sixth transistor $Q_6$ will be $I_6 = n_1 \cdot n_2 \cdot I_M$.

Figure 2B:
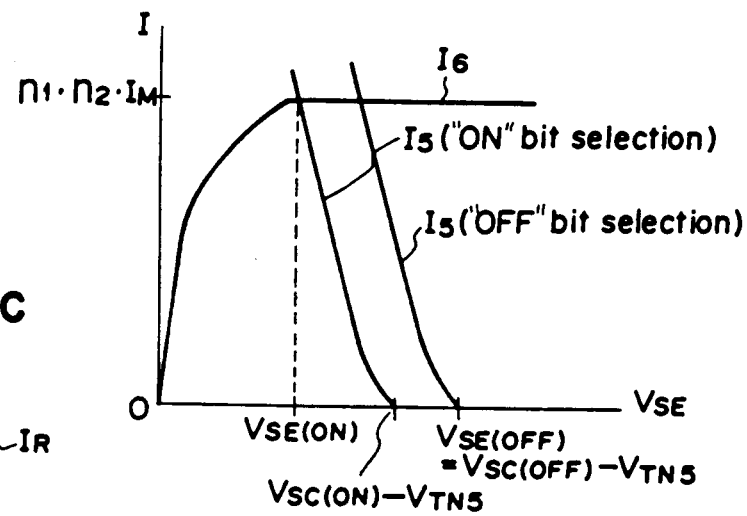

In FIG. 2b, the point where the current $I_5$ ("ON bit" selection) = $I_6$ indicates the voltage $V_{SE(ON)}$ at the node SE at the "ON bit" selection and the relation will be shown as $V_{SE(ON)} = V_{SC(ON)} - V_{TN5} - \alpha$. Here, the voltages $V_{TP}$ and $V_{TN5}$ are respectively the threshold voltages of the field effect transistors $Q_2$ and $Q_5$ and $\alpha$ is a value which is determined by the ratio between the gate width to gate length of the transistor $Q_5$ and that of the transistor $Q_6$.

On the other hand, the voltage $V_{SE(OFF)}$ at the same node SE at the "OFF bit" selection may be shown by $V_{SE(OFF)} = V_{SC(OFF)} = V_{SC(OFF)} - V_{TN5}$. In the reference voltage generating circuit 120, the dummy cell MR is set so as to allow the flow of current $I_R = I_M$ at the read-out operation. Between the output circuit 115 in the sense-amplifier circuit 110 and the corresponding circuit 130 in the reference voltage generating circuit 120, the only difference that exists is in the ratio of the gate width to gate length of the transistors $Q_3$ and $Q_{R3}$.

Assuming that the ratio of the gate width to gate length of the transistor $Q_3$ is $\beta_3$ and that of the transistor $Q_{R3}$ is $\beta_{R3}$ and that the design is made so as to satisfy the relation of $\beta_3:\beta_{R3} = k:1$ (k: real number), the current that flows into the transistor $Q_{R6}$ will be $I_{R6} = n_1/k \cdot n_4 \cdot I_R$. Here, since $n_2 = n_4$, $I_M = I_R$, the current $I_{R6}$ which equals to $n_1/k \cdot n_2 \cdot I_M = I_6/k$ flows in the transistor $Q_{R6}$. Thus, the voltage $V_{RE}$ is balanced at a higher potential as compared with $V_{SE(ON)}$ and the relation of $V_{SE(ON)} < V_{RE} < V_{SE(OFF)}$ is established.

Figure 2C:
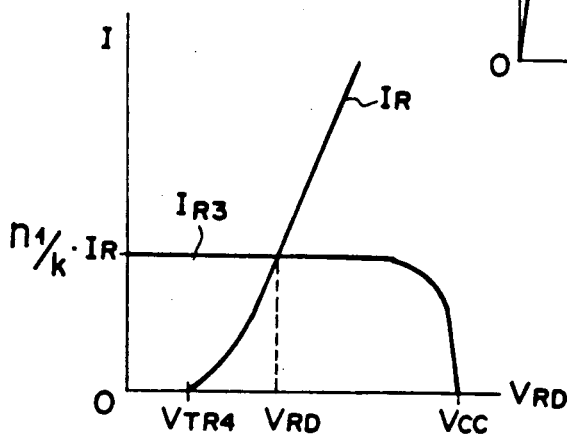
Figure 2D:
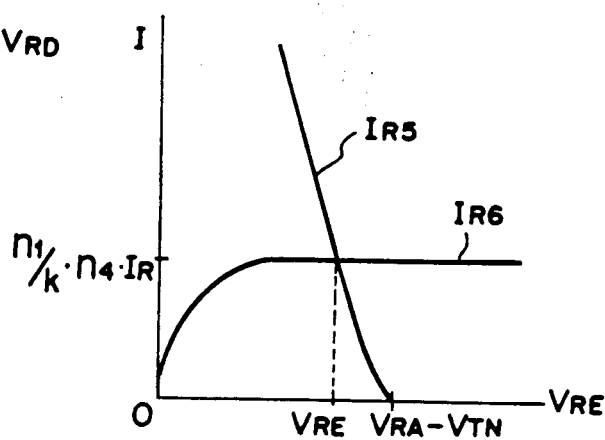

FIG. 2c and FIG. 2d show the current-voltage characteristic curves of the transistors $Q_{R3}$ through $Q_{R6}$. It is shown therein that $I_{R3}$, $I_{R6}$ will respectively become $1/k$ of $I_3$, $I_6$, resulting in the respective relations of $V_{SD(OFF)} < V_{RD} < V_{SD(ON)}$ and $V_{SE(ON)} < V_{RE} < V_{SE(OFF)}$.

FIG. 1 includes an example of the comparison detector 140. This comparison detector 140 comprises a pair of N-channel type field effect transistors $Q_{41}$, $Q_{42}$ and also a pair of P-channel type field effect transistors $Q_{43}$, $Q_{44}$ and it produces an output after comparing the output voltage $V_{SE}$ from the sense-amplifier circuit 110 with the reference voltage $V_{RE}$ from the reference voltage generating circuit 120. Since the relation is $V_{SE(ON)} < V_{RE}$ at the "ON bit" selection, the voltage $V_{SF}$ at the node SF increases and therefore the resultant output voltage $V_{SO}$ from the inverter amplifier 145 goes to the GND (ground) level.

On the other hand, the relation between the voltage at the node SE and the reference voltage from the circuit 120 at the "OFF bit" selection is $V_{RE} < V_{SE(OFF)}$, the node voltage $V_{SF}$ goes down and therefore the resultant output voltage $V_{SO}$ goes to the $V_{CC}$ level (power supply voltage). FIG. 3 shows voltage waveforms at the respective nodes SA, SB, SC, SF and SO. As is clear from these waveforms, the inversion speed in the sense-amplifier output $V_{SE}$ according to this embodiment is much faster as compared with the sense-amplifier output $V_{SJ}$ in the conventional arrangement shown in FIG. 10.

The higher inversion speed achieved in the embodiment as compared with the prior art as explained above results from the increase in the amplification of current and the reduction in the amplitude of the output $V_{SE}$ in the sense-amplifier circuit.

Figure 4:
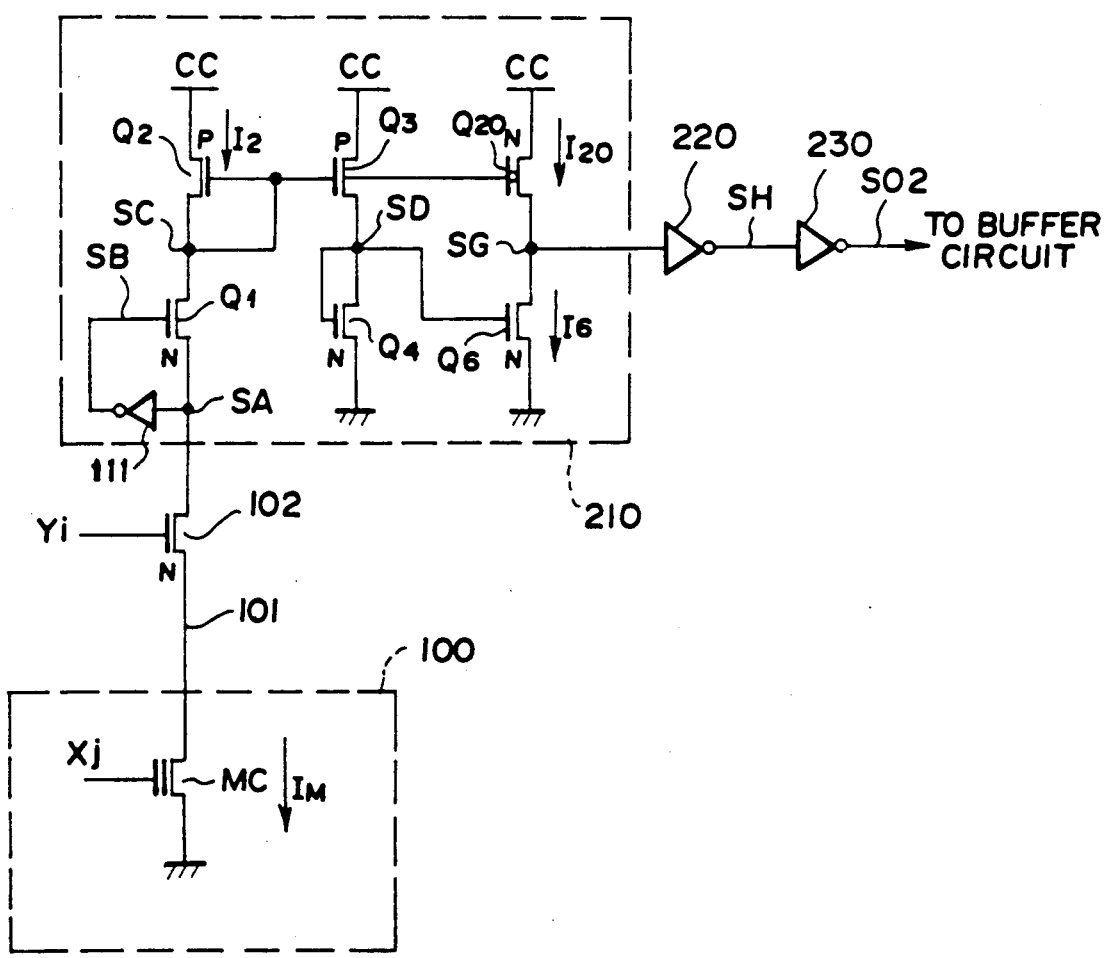
FIG. 4 shows a circuit diagram of a semiconductor memory of another embodiment according to the invention.

FIG. 4 shows another embodiment of the present invention. Here again, the same numerals and symbols as used in the first embodiment are used for the same elements and parts.

Figure 5:
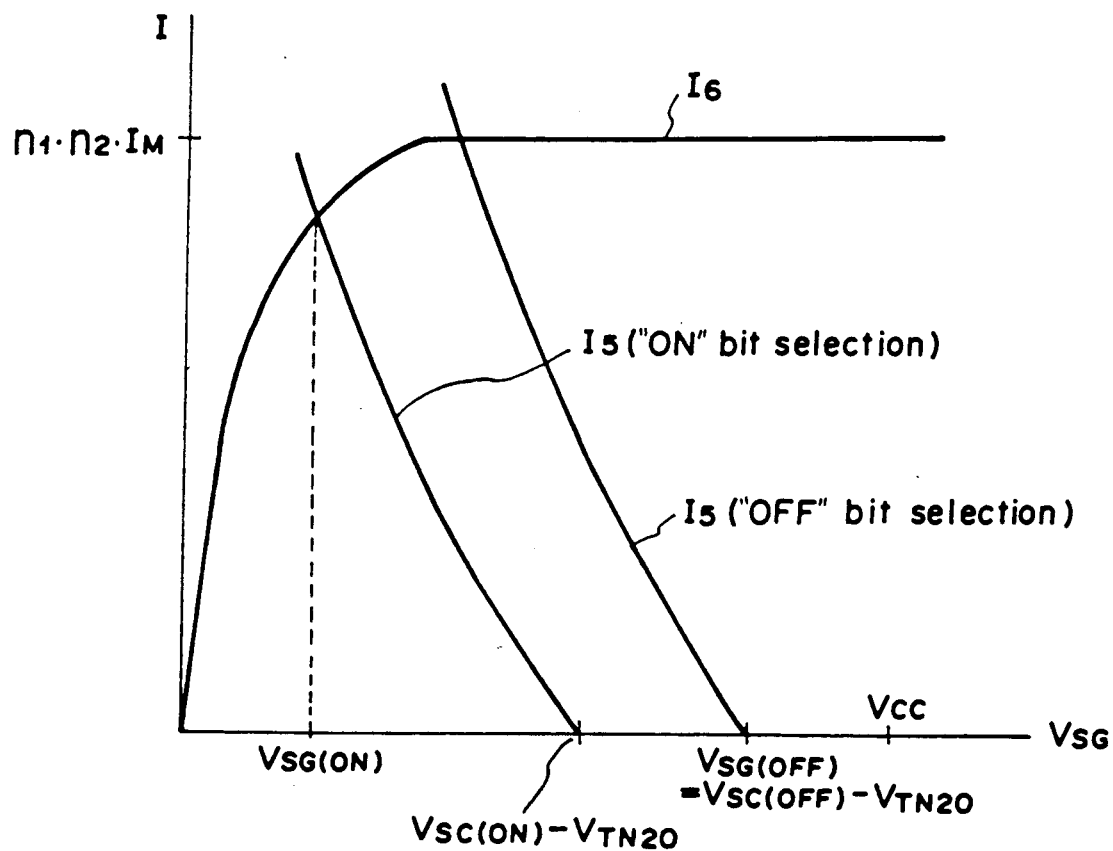
FIG. 5 shows current-voltage characteristic curves of the sense-amplifier circuit involved in the circuit shown in FIG. 4.

A field effect transistor $Q_{20}$ in this embodiment is of an N-channel non-doped type. FIG. 5 shows the current-voltage characteristic curves of the transistors $Q_6$ and $Q_{20}$. A voltage $V_{TN20}$ referred to herein is a threshold voltage of the transistor $Q_{20}$ and is approximately 0 volt. Thus, the voltage $V_{SG}$ at the node SG at the "OFF bit" selection is shown as $V_{SG(OFF)} = V_{SC(OFF)} - V_{TN20} = V_{SC(OFF)} = V_{CC} - V_{TP}$.

Figure 6:
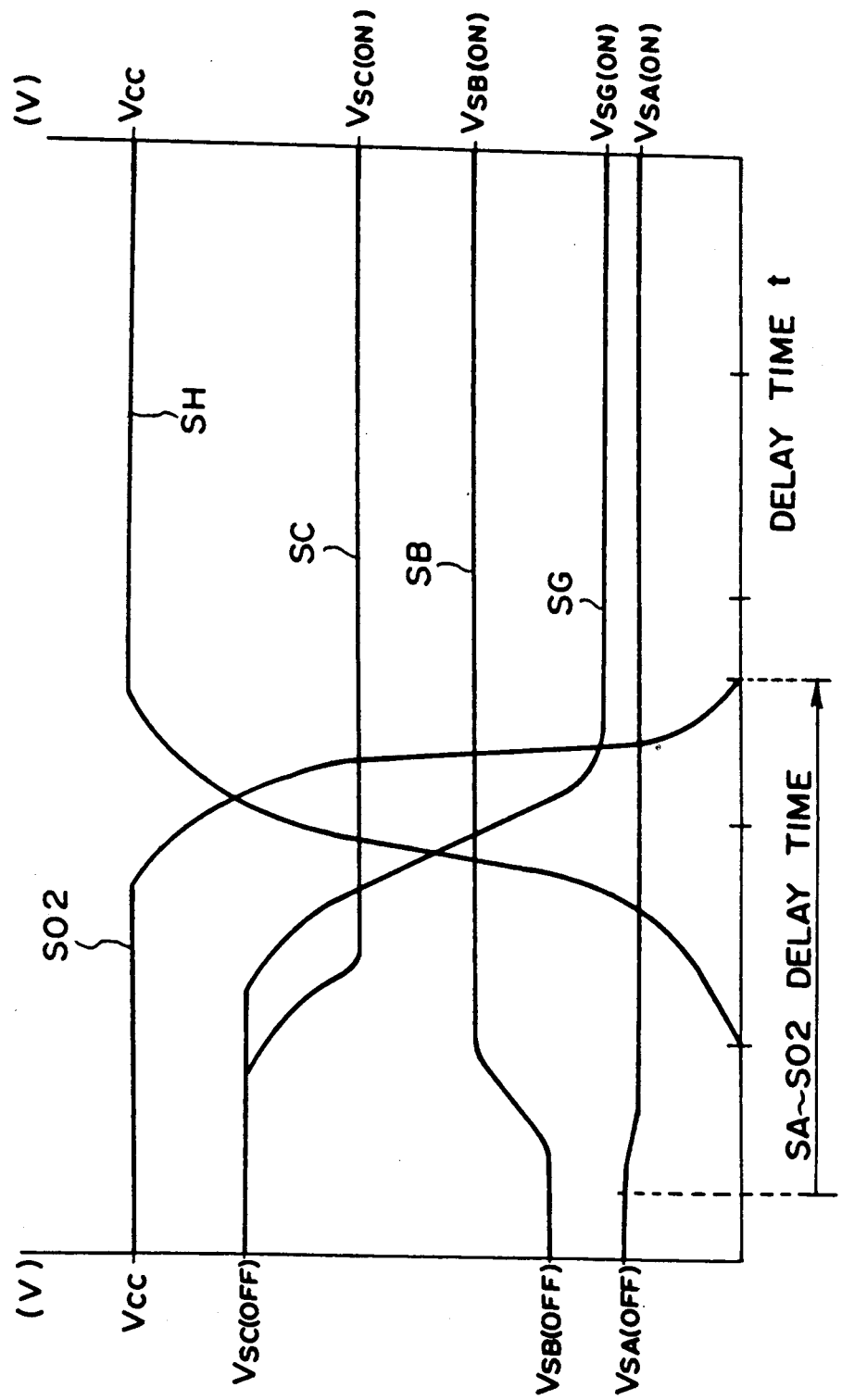
FIG. 6 shows voltage waveforms at the respective nodes in the circuit shown in FIG. 4.

On the other hand, at the "ON bit" selection, the voltage $V_{SG}$ is shown as $V_{SG(ON)} = V_{SC(ON)} - V_{TN20} - \alpha = V_{SC(ON)} - \alpha = V_{CC} - V_{TP} - \alpha$ and here $\alpha$ is the value which is determined by the ratio between the gate width to gate length of the transistor $Q_{20}$ and that of the transistor $Q_6$. In the present embodiment, the desired inversion at an inverter amplifier 220 is ensured by the setting of $\alpha$ at a large value, that is, by the setting of a large amplitude of the sense-amplifier circuit output voltage $V_{SG}$. FIG. 6 shows voltage waveforms at the respective nodes SB, SC, SG, SH and SO2 shown in FIG. 4. As is readily understood from these waveform curves, the inversion speed of $V_{SG}$ is high because the amplification of current is larger in the circuit of this embodiment as compared with that in the conventional arrangement. Further, by the setting of the amplitude of voltage at the node SG at a desired value, the inverter amplifier 220 can be driven without involving a comparison detector so that, unlike in the conventional arrangement, there is no need for the circuit of this embodiment to have the reference voltage generating circuit 320 and this contributes to the simplification of the circuit construction. The threshold voltage $V_{T220}$ of the inverter amplifier 220 is set so as to satisfy the relation of $V_{SG(ON)} < V_{T220} < V_{SG(OFF)}$.

One of the main advantages in the semiconductor memory device according to the present invention is that, since the amplification of current in the sense-amplifier circuit is increased while the amplitude of the sense-amplifier output is decreased, the inversion speed of the sense-amplifier output is high and this renders the device according to the present invention to suitable for devices which require a high speed read-out operation.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor memory device including a plurality of memory cells organized in a matrix structure and a sense-amplifier circuit for detecting a voltage at a digit line which changes in accordance with the stored information in the memory cell, said sense-amplifier circuit comprising:
   a first inverter amplifier having its input coupled to said digit line;
   a first field effect transistor having its gate connected to the output of said first inverter amplifier and its source electrically coupled to said digit line;
   a second field effect transistor having its source connected to a first power supply terminal and its gate and drain connected to the drain of said first field effect transistor;
   a third field effect transistor having its gate connected to the drain of said first field effect transistor and its source connected to said first power supply terminal;
   a fourth field effect transistor having its gate and drain connected to the drain of said third field effect transistor and its source connected to a second power supply terminal;
   a fifth field effect transistor having its gate connected to the drain of said second field effect transistor, its drain connected to said first power supply terminal and its source connected to one input of a comparison detector; and
   a sixth field effect transistor having its gate connected to the drain of said third field effect transistor, its drain connected to the source of said fifth field effect transistor and its source connected to said second power supply terminal.

2. A semiconductor memory device according to claim 1, further comprising a reference voltage generating circuit including a dummy memory cell and a reference sense-amplifier circuit for detecting a voltage at a dummy digit line which changes in accordance with the information in said dummy memory cell, said reference sense-amplifier comprising:
   a first reference inverter amplifier having its input coupled to said digit line;
   a first reference field effect transistor having its gate connected to the output of said first reference inverter amplifier and its source electrically coupled to said dummy digit line;
   a second reference field effect transistor having its source connected to a first power supply terminal and its gate and drain connected to the drain of said first reference field effect transistor;
   a third reference field effect transistor having its gate connected to the drain of said first reference field effect transistor and its source connected to said first power supply terminal;
   a fourth reference field effect transistor having its gate and drain connected to the drain of said third reference field effect transistor and its source connected to a second power supply terminal;
   a fifth reference field effect transistor having its gate connected to the drain of said second reference field effect transistor, its drain connected to said first power supply terminal and its source connected to the other input of said comparison detector; and
   a sixth reference field effect transistor having its gate connected to the drain of said third reference field effect transistor, its drain connected to the source of said fifth reference field effect transistor and its source connected to said second power supply terminal.

3. A semiconductor memory device according to claim 1, wherein said third field effect transistor has a gate width to gate length ratio $\beta_3$ different from the $\beta_{R3}$ of said third reference field effect transistor with a relation of $\beta_3 = k \cdot \beta_{R3}$ (k is a real number).

4. A semiconductor memory device according to claim 2, wherein said comparison detector is a differential amplifier including a pair of P-channel type field effect transistors and a pair of N-channel type field effect transistors having gates to which the outputs of said sense-amplifier circuit and said reference voltage generating circuit are applied, respectively, and the output of said comparison detector is supplied to a second inverter connected to an output buffer.

5. A semiconductor memory device according to claim 2, wherein said first power supply terminal and said second power supply terminal are coupled to a constant power potential and a ground potential, respectively, and said second and third field effect transistors and said second reference and third reference field effect transistors are of a P-channel type and said first, fourth to sixth field effect transistors and said first reference, said fourth to sixth reference field effect transistors are of an N-channel type.

6. A semiconductor memory device according to claim 1, wherein the respective gate width to gate length ratios $\beta_2$ and $\beta_3$ of said second and third field effect transistors have a relation of $\beta_3 = n_1 \cdot \beta_2$ where $n_1$ is a real number larger than one, and the respective gate width to gate length ratios $\beta_4$ and $\beta_6$ of said fourth and sixth field effect transistors have a relation of $\beta_6 = n_2 \cdot \beta_4$ where $n_2$ is a real number larger than one.

7. A semiconductor memory device including a plurality of memory cells and a sense-amplifier circuit for detecting a voltage at a digit line which changes in accordance with the stored information in the memory cell, said sense-amplifier circuit comprising:

a first inverter amplifier having its input coupled to said digit line;

a first field effect transistor having its gate connected to the output of said first inverter amplifier and its source electrically coupled to said digit line;

a second field effect transistor having its source connected to a first power supply potential and its gate and drain connected to the drain of said first field effect transistor;

a third field effect transistor having its gate connected to the drain of said first field effect transistor and its source connected to said first power supply potential;

a fourth field effect transistor having its gate and drain connected to the drain of said third field effect transistor and its source connected to a second power supply potential;

a fifth field effect transistor having its gate connected to the drain of said second field effect transistor, its drain connected to said first power supply potential and its source connected to an input of a second inverter amplifier as an output of said memory device; and a sixth field effect transistor having its gate connected to the drain of said third field effect transistor, its drain connected to the source of said fifth field effect transistor and its source connected to said second power supply potential.

8. A semiconductor memory device according to claim 7, wherein said fifth field effect transistor is formed of an N-channel non-doped type, and the ratio $\alpha$ between the gate width to gate length of said fifth field effect transistor and that of said sixth field effect transistor is set at a large value so as to increase the amplitude of the output voltages of said sense-amplifier circuit.

9. A semiconductor memory device according to claim 7, wherein said first power supply potential and said second power supply potential are a constant supply voltage and a ground potential, respectively, and said second and third field effect transistor are of a P-channel type and said first and fourth to sixth field effect transistors are of an N-channel type.

* * * * *